Nov. 28, 1950 J. D. HOLLAND ET AL 2,531,434

VARIABLE FREQUENCY SELECTIVE CIRCUITS

Filed July 17, 1947 2 Sheets-Sheet 1

Inventors
John Douglas Holland
Duncan Dove Robinson
by
Robert Harding Jr.
Attorney Nov. 28, 1950 J. D. HOLLAND ET AL 2,531,434

VARIABLE FREQUENCY SELECTIVE CIRCUITS

Filed July 17, 1947 2 Sheets-Sheet 2

Inventors
John Douglas Holland
Duncan Done Robinson
by
Robert Harding Jr
Attorney Patented Nov. 28, 1950

2,531,434

UNITED STATES PATENT OFFICE 2,531,434

VARIABLE FREQUENCY SELECTIVE CIRCUITS

John Douglas Holland and Duncan Dove Robinson, London, England, assignors to International Standard Electric Corporation, New York, N. Y.

Application July 17, 1947, Serial No. 761,614
In Great Britain July 13, 1946

Section 1, Public Law 690, August 8, 1946
Patent expires July 13, 1966

6 Claims. (Cl. 250—40)

Figure 1:
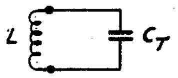

The present invention relates to frequency selective circuits in which the resonant frequency is made variable over a given range of frequencies and is particularly directed in such a circuit to the control of effects of small variations in the values of the circuit elements upon the resonant frequency as determined by the adjustment of a tuning element. These small circuit element changes may be deliberately made by the user—as in the case of vernier tuning adjustments—or may be unwanted—as in the case of ambient temperature effects. Although attention will be directed to cases where ambient temperature or vernier tuning control are the parameters effecting such circuit elements, it is conceivable that a variable frequency tuned circuit may be used in circumstances where some other parameter, such as mechanical strain, may give rise to changes in certain of the circuit elements values. In order, as far as possible, to use a generic term, the changes will be considered as proportioned to variation coefficients of the values of the elements in question with respect to a given parameter.

In a fixed frequency tuned circuit it is usually a fairly straightforward matter to regulate the resonant frequency variation of the whole circuit in terms of variation coefficients of the circuit components. When the circuit may be tuned over a band of frequencies, however, regulation is not so simple. In the case of temperature compensation there have been proposals to achieve compensation by means such as designing the tuning condenser to have a different temperature coefficient according to the setting of the condenser. In the same way difficulty arises if it be desired to arrange that the deviation obtained by a vernier tuning control shall obey a definite law throughout the frequency band. We have found, however, that by the simple choice of component values and of the variation coefficient thereof, it is possible in a circuit comprising say an inductance and three condensers, to predetermine the proportioned frequency variation at any two given frequencies and, further, to arrange that this shall be nearly constant throughout the frequency band covered by the tuned circuit.

According to the present invention there is provided a frequency selective circuit comprising four or more reactive elements, at least one of which is variable so as to tune said circuit to different frequencies within a given range, in which the variation coefficients, as hereinbefore defined, of at least two of the other of said elements are adjusted so as to cause the overall proportional frequency deviation, $$\frac{d\omega}{\omega}$$

of the resonant frequency, caused by changes in that parameter to which said variation coefficients are related, to be substantially predetermined for two settings of said variable reactance element. The invention further provides such a circuit in which said predetermined values of $$\frac{d\omega}{\omega}$$

are the same and in which the two settings of said variable reactance elements are so chosen that $$\left|\frac{d\omega}{\omega}\right|$$

varies a minimum amount from said predetermined value of $$\frac{d\omega}{\omega}$$

within said given range.

In order that the invention may be more fully understood, an analysis of certain circuit configurations will now be given and reference made to the accompanying drawings which are for the most part purely explanatory in nature and which it is, therefore, not proposed to list figure by figure.

In its simplest form a parallel tuned circuit may be reduced to the configuration of Fig. 1, in which L is the tuning inductance and $C_T$ the total effective tuning capacity. Then for resonance of frequency $$\frac{\omega}{2\pi}$$

we have $$\omega^2 L C_T = 1$$

so that $$\frac{2d\omega}{\omega} + \frac{dL}{L} + \frac{dC_T}{C_T} = 0 \qquad (1)$$

It will be convenient to assume that the change represented in Equation 1 is due to an increment in some implicit parameter such as temperature and that the decremental changes indicated are those due to unit variations of the said parameter. Hence, if $\alpha$ and $\theta_T$ are the inductance and total capacity coefficients associated with the said parameter, (1) may be rewritten $$\frac{2d\omega}{\omega} + \alpha + \theta_T = 0 \qquad (1a)$$

We shall consider first the case where it is desirable that $$\frac{d\omega}{\omega}$$

may be as small as possible, as in the case where we are dealing with temperature variation. This hypothesis requires that $$\alpha+\theta_T\rightarrow 0 \qquad (2)$$

over the range of variation.

In general it is a matter of considerable difficulty to predetermine temperature coefficients of variable condensers. Furthermore, $C_T$ will inevitably include a minimum capacity $C_0$, due to wiring and valve capacities and the like, directly shunting L; hence we cannot in practice have a circuit simpler than that of Fig. 2 in which $C_0$ in parallel with a variable condenser $C_2$ constitute $C_T$.

Figure 3:
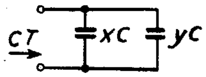
Figure 4:
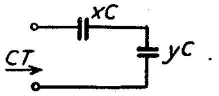

Before proceeding further, it is well to establish the value of $\theta_T$ for two condensers, each having different coefficients, in parallel and in series. Referring to Fig. 3 and Fig. 4, the two capacities are denoted by $x$C and $y$C, $x$ and $y$ being numerical multipliers, and it is assumed that the respective coefficients of these condensers are $\lambda$ and $\mu$. Then for the parallel case $$\left.\begin{aligned} C_T&=(x+y)C\\ \theta_T&=\frac{\lambda x+\mu y}{x+y}\end{aligned}\right\} \qquad (3a)$$

and for condensers in series $$\left.\begin{aligned} C_T&=\frac{xy}{x+y}C\\ \theta_T&=\frac{\mu x+\lambda y}{x+y}\end{aligned}\right\} \qquad (3b)$$

Figure 2:
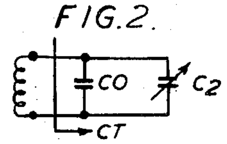

Returning now to the circuit of Fig. 2, let us assume that $C_2=nC_0$, where $n$ is variable to change the resonant frequency, and that the coefficient, say of temperature, of $C_0$ and $C_1$ are $\phi$ and $\beta$ respectively. Then $$\left.\begin{aligned} C_T&=\frac{n}{1+n}C_0\\ \theta_T&=\frac{\phi+\beta n}{1+n}\end{aligned}\right\} \qquad (4)$$

Combining Equations 2 and 4 it will be seen that in order to obtain compensation we must have $$\phi+\alpha+n(\alpha+\beta)=0 \qquad (5)$$

from which it is seen that if compensation is to be obtained throughout the tuning range, i. e. for all values of $n$, we must have $$\beta=\phi=-\alpha$$

From what has been said before, since $\beta$ and also $\alpha$ must usually be regarded as given in the case of temperature coefficients, this condition cannot, in general, be fulfilled except at one particular frequency corresponding to an $n$ value of $n_a$. At this frequency compensation can be obtained, however, provided we make $$\phi=-\{\alpha(1+n_a)+n_a\beta\} \qquad (6)$$

In particular, if $n_a\ll 1$, and $\phi=-\alpha$, there will be compensation at the highest frequency within the range. This means, in practice, that we can build out $C_0$ to a suitable value by means of fixed condensers employing a dielectric having a negative temperature coefficient.

Figure 5:
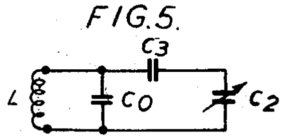

In order that more complete compensation may be obtained another controllable circuit element must be introduced. It is obvious that no further improvement is to be gained by adding elements in parallel, except possibly in order to obtain the required value of $\phi$ more readily. The other alternative, is to insert a third condenser in series with $C_2$. In Fig. 5, $C_3$, of value $aC_0$ and having a coefficient $\gamma$, represents this additional element. It should be observed that the configuration shown in Fig. 5 is that usually adopted for the local oscillator tank circuit in superheterodyne receivers when it is desired to gang together the signal frequency tuning condensers with the oscillator tuning condenser $C_2$, and it is therefore particularly aposite.

From consideration of Equations 3, or otherwise, the values of $C_T$ and $\phi$ for the circuit of Fig. 5 are found to be $$\left.\begin{aligned} C_T&=C_0\left[1+\frac{an}{a+n}\right]\\ \theta&=\frac{n^2(\phi+a\gamma)+an(2\phi+a\beta)+a^2\phi}{n^2(1+a)+an(2+a)+a^2}\end{aligned}\right\} \qquad (7)$$

so that the compensation condition becomes $$n^2\{\phi+\alpha+a(\gamma+\alpha)\}+an\{2(\phi+\alpha)+a(\beta+\alpha)\}+a^2(\phi+\alpha)=0 \qquad (8)$$

For complete compensation for all frequencies within the range we require $$\phi=\beta=\gamma=-\alpha$$

similarly to the result previously obtained. However, it is now possible to effect compensation for two values of $n$ by giving $\phi$ and $\gamma$ values to satisfy Equation 8 at those given $n$. In general, for any particular frequency range, it would be better to obtain exact compensation at two $n$ values not at the extremes of the range.

Substituting Equation 7 in 1$a$ we have $$\frac{2d\omega}{\omega}+\alpha+\frac{(n+a)^2\phi+n^2a\gamma+na^2\beta}{(n+a)^2+an(n+a)}=0 \qquad (9)$$

If we make $$\frac{d\omega}{\omega}$$

vanish at two arbitrary values of $n$, $\psi$, and $\psi_2$, by eliminating $\phi$ and $\gamma$ in Equation 9 we obtain $$\frac{d\omega}{\omega}=(\alpha+\beta)\frac{a^2b}{2\{2\psi_1\psi_2+a(\psi_1+\psi_2)\}}\cdot\frac{(n-\psi_1)(n-\psi_2)}{(a+n)(b+n)} \qquad (10)$$

where $$b=\frac{a}{a+1}$$

Figure 6:
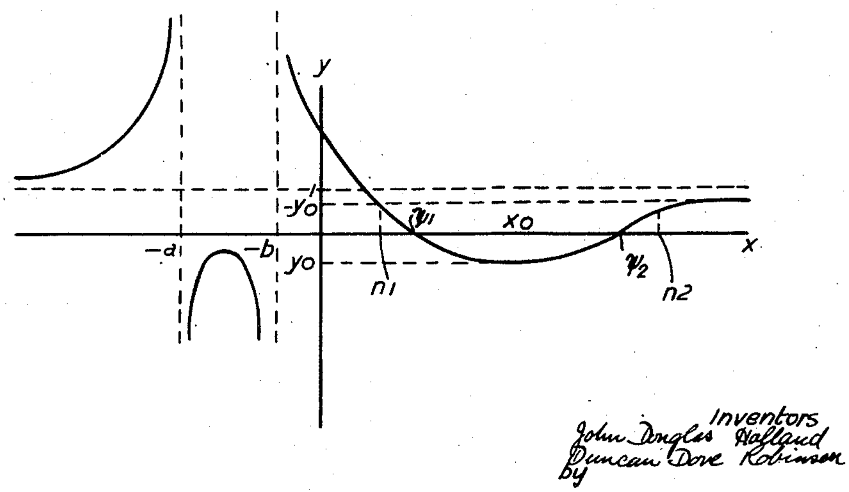

The general shape of the curve $$y=\frac{(n-\psi_1)(n-\psi_2)}{(n+a)(n+b)}$$

is shown in Fig. 6. The curve has asymptotes $n=-a$, $n=-b$, and $y=1$. In the region of positive values of $n$, there is a minimum at $(n_0, y_0)$. Hence, provided $|y_0|<1$ there will be two points on the curve to the right of $n=-b$ having ordinates $-y_0$ and abscissa $n_1$, $n_2$ say. Thus, for a given deviation of $\pm y_0$, $n$ may vary between $n_1$ and $n_2$. Conversely, if $n_1$ and $n_2$ be given limits of variation of $n$, $y$ will be as small as possible within this range if the zeros are chosen so that the ordinates at $n_1$ and $n_2$ are each equal in magnitude but opposite in sign to the resulting value of $y_0$.

Since $$\frac{dy}{dn}=y\left(\frac{1}{n-1}+\frac{1}{n-2}-\frac{1}{n+a}-\frac{1}{n+b}\right)$$

we have the set of equations $$y_0\frac{(n_0-\psi_1)(n_0-\psi_2)}{(n+a)(n+b)}=\frac{2n_0-(\psi_1+\psi_2)}{2n_0+(a+b)}=-\frac{(n_1-\psi_1)(n_1-\psi_2)}{(n_1+a)(n_1+b)}=-\frac{(n_2-\psi_1)(n_2-\psi_2)}{(n_2+a)(n_2+b)} \quad (11)$$

from which we obtain $$n_0^2(n_1+n_2+a+b)-2n_0(n_1n_2-ab)-\{n_1n_2(a+b)+ab(n_1+n_2)\} \quad (12)$$

$$y_0=\frac{2n_0-(n_1+n_2)}{2n_0+(n_1+n_2)+2(a+b)} \quad (13)$$

$$\psi_1+\psi_2=2n_0-y_0(2n_0+a+b) \quad (14)$$

$$\psi_1+\psi_2=n_0^2-y_0(n_0^2-ab) \quad (15)$$

and finally from Equation 11

$$\left.\begin{aligned}\phi&=-\left\{\alpha+\frac{a\psi_1\psi_2}{a(\psi_1+\psi_2)+2\psi_1\psi_2}(\alpha+\beta)\right\}\\ \gamma&=-\left\{\alpha+\frac{a^2-\psi_1\psi_2}{a(\psi_1+\psi_2)+2\psi_1\psi_2}(\alpha+\beta)\right\}\end{aligned}\right\} \quad (16)$$

As a practical example, let us take the case of a local oscillator tank circuit to cover a signal frequency range of 1 to 2 mc./s. with an intermediate frequency of 580 kc./s. The circuit components are assumed to have the following values:

$L=32\ \mu h.$: $C_0=100\ \mu\mu f.$: $(C_2)_{max}=315\ \mu\mu f.$: $C_3=630\ \mu\mu f.$ so that $n_1=0.181$; $n_2=3.5$; $a=6.3$; $b=0.863$ while $\alpha=50\ \mu\mu f./\mu\mu f./C^0$; $\beta=75\ \mu\mu f./\mu\mu f./C^0$ from which $n_0=1.06$; $y^0=-6.13\times10^{-2}$ $\psi_1=2.316$; $\psi_2=0.3713$ and $\phi=-86\ \mu\mu f./\mu\mu f./C^0$; $\gamma=-310\ \mu\mu f./\mu\mu f./C^0$ Equation 12 may be written in the form $$\frac{d\omega}{\omega}=A(\alpha+\beta)y$$

where A=0.918 for the present example.

Figures 7, 8, 9, 10:
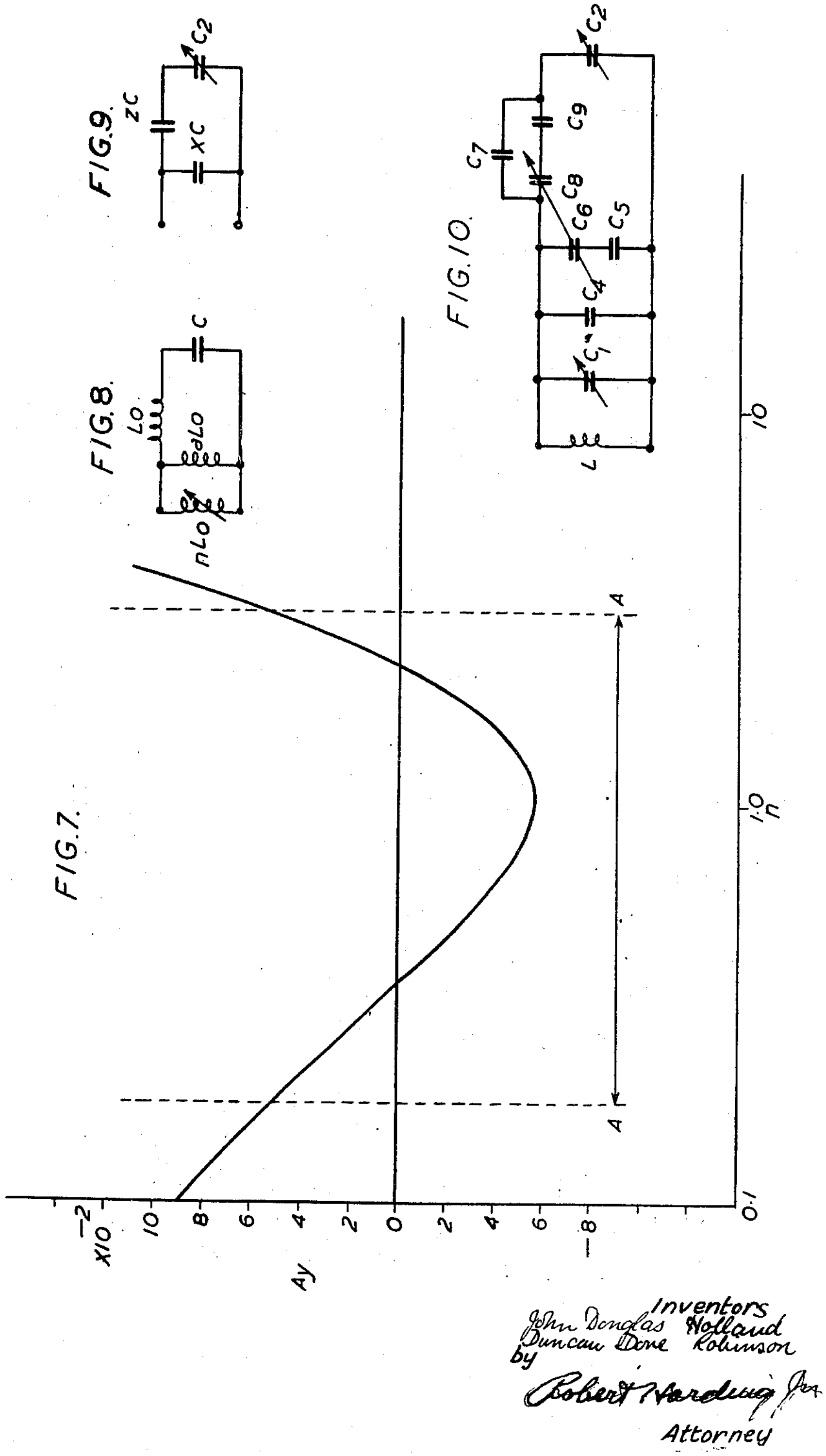

The resulting curve for $Ay$ is shown in Fig. 7, the range to be covered being indicated by AA. The maximum variation of $Ay$ is $\pm5.63\times10^{-2}$.

Although we have been considering the case of a circuit with a variable tuning condenser, an analogous circuit may be derived in which a variable inductance is used. The circuit of Fig. 8, in which $\alpha$ is now the coefficient of C, $\beta$ of the variable inductance $nL_0$, $\phi$ of $L_0$ and $\gamma$ of $aL_0$, is exactly equivalent in analysis to that of Fig. 5.

The case where a given adjustment of a vernier tuning control is desired to cause a proportional frequency deviation which is constant throughout the main tuning range of the circuit is very similar to the above. $\alpha$ and $\beta$ become zero, while $\phi$ and $\gamma$ are chosen so that $$\frac{d\omega}{\omega}$$

instead of being zero, sends to a constant value K, say, between $n_1$ and $n_2$.

Insofar as the previous analysis is concerned, this change is merely equivalent to substituting $-2K$ for $\alpha$ and putting $\beta=0$, combined with a shift of the origin of co-ordinates effected by writing $$\frac{d\omega}{\omega}-K$$

in place of $$\frac{d\omega}{\omega}$$

wherever the latter appears in the analysis from Equation 8 onwards. The method of calculation being the same, it remains to utilize the results in a practicable manner. Since $\phi$ and $\gamma$ are not, in general, equal, modification of the circuit of Fig. 5 is called for if it is desired to use similar trimmer condensers in both $C_3$ and $C_0$. It will be found that, for the general case where the mean values of $C_0$, and $C_3$ are given, and $\gamma$ and $\phi$ are due to equal increments in similar trimmer condenser capacities, the simplest arrangement is to replace each of $C_0$ and $C_3$ by the capacity network shown in Fig. 9, the values of $x$ and $y$ being different for the two networks, but the mean capacity C and its variation coefficient $\lambda$, say, being the same in each case.

For the network of Fig. 9 we have $$C_T=C\left(x+\frac{y}{1+y}\right):\theta_T=\left(\frac{y}{1+y}\right)^2\lambda\frac{C}{C_T} \quad (17)$$

in which $\lambda$ is the variation coefficient of the trimmer condenser C.

In terms of $C_T$, $\theta_T$, C and $\lambda$, the values of $x$ and $y$ are given by $$\frac{y}{1+y}=\sqrt{\frac{C_T}{C}\frac{\theta}{\lambda}};\ x=\sqrt{\frac{C_T}{C}}\left(\sqrt{\frac{C_T}{C}}-\sqrt{\frac{\theta}{\lambda}}\right) \quad (18)$$

and the conversion is possible provided $$\frac{C_T}{C}>\frac{\theta}{\lambda}$$

One particular arrangement of a resonant circuit to which the above principles may be applied is shown in Fig. 10. $C_2$ is the main tuning condenser and $C_1$ is adjusted to take up the effects of variation in the wiring or valve capacities of the external circuit. $C_6$ and $C_8$ are the trimmer condensers ganged together and to a vernier tuning control. The combination consisting of $C_1$, $C_4$, $C_5$ and $C_6$, together with any external circuit capacity comprises the $C_0$ of Fig. 5 and the combination of $C_7$, $C_8$ and $C_9$ comprise $C_3$.

It will be evident that provided the trimmer condensers of Fig. 10 have very small temperature coefficients—say less than $5\times10^{-6}$ $\mu\mu f./\mu\mu f./C^0$ $C_4$ and $C_7$ may have their temperature coefficients adjusted so as to provide temperature compensation in accordance with the present invention.

An examination of the condenser network of Fig. 9 and of Equations 17 and 18 shows that when $x\gg1$, $C_T$ is practically independent of $y$ so that the proportionality between $\theta_T$ and $\lambda$ depends directly on the values of $$\frac{y}{1+y}$$

Hence, in Fig. 10, $C_5$ and $C_9$ could be made variable and ganged together to vary the amount of deviation provided by the vernier tuning control without appreciably effecting the constancy thereof throughout the tuning range covered by the main tuning condenser $C_2$. One application of such a modification is in connection with a cathode ray oscillograph used as a spectrometer. The resonant circuit of Fig. 10 provides the tuned circuit of an oscillator whose output is fed to a circuit whose frequency response curve, for example, it is required to reproduce on the oscillograph screen. $C_6$ and $C_8$ may be rotating condensers, or might well represent electronic reactance circuits, varying in step with the sweep circuit of the oscillograph so as to provide a frequency modulated output to the circuit under test. In this case the condensers $C_5$ and $C_9$ could be varied together to open out or close up the width of the display on the oscillograph screen.

What is claimed is:

1. A frequency selective circuit comprising a variable reactance, a first reactance connected to said variable reactance, second and third reactances connected in parallel with one another and in parallel with said connection of said variable and first reactances, all said reactances having temperature coefficients equal in size and said third reactance only having a temperature coefficient opposite in sign to that of said other reactances.

2. A frequency selective circuit comprising a variable condenser, a first fixed condenser connected in series therewith, an inductance and a second fixed condenser connected in parallel with one another and in parallel with said series connection of said variable and first fixed condenser, said condensers having equal temperature coefficients and said inductance having a temperature coefficient equal in size and opposite in sign to said first mentioned temperature coefficients.

3. A frequency selective circuit according to claim 2, in which each of said fixed condensers comprises a group of condensers of like value having different temperature coefficients and adapted to be connected in series or parallel relationships so that the most nearly correct value of the temperature coefficient of the group may be obtained without alteration of the total capacity of the group.

4. A frequency selective circuit according to claim 3 in which some of said condensers in said groups comprise subsidiary variable condensers ganged to a vernier tuning control whereby the proportional variation of capacity of each of said groups due to a given change of said vernier control is adjusted by choice of suitable values of associated fixed condensers in each said group to give a predetermined value of frequency deviation at two settings of said first-mentioned variable condenser.

5. A frequency selective circuit according to claim 4 in which the temperature coefficient of said subsidiary variable condensers are made very small compared to the coefficients of the other condensers of each of said groups whereby adjustment of the temperature coefficients of said fixed condensers in each of said groups will provide a group temperature coefficient of the desired value.

6. A frequency selective circuit comprising a variable inductance, a first fixed inductance connected in series therewith, and a condenser and a second fixed inductance connected in parallel with one another and in parallel with said series connection of said variable and first fixed inductances, said inductances having equal temperature coefficients and said condenser having a temperature coefficient equal in size and opposite in sign to said first mentioned temperature coefficients.

JOHN DOUGLAS HOLLAND.
DUNCAN DOVE ROBINSON.

REFERENCES CITED

The following references are of record in the file of this patent:

UNITED STATES PATENTS

| Number | Name | Date |
|---|---|---|
| 2,005,772 | Chireix | June 25, 1935 |
| 2,231,389 | Koffyberg | Feb. 11, 1941 |
| 2,250,090 | Buschbeck | July 22, 1941 |
| 2,310,797 | Lea | Feb. 9, 1943 |